US009650512B2

(12) United States Patent
Wang et al.

(10) Patent No.: US 9,650,512 B2
(45) Date of Patent: May 16, 2017

(54) HALOGEN-FREE RESIN COMPOSITION, COPPER CLAD LAMINATE USING THE SAME, AND PRINTED CIRCUIT BOARD USING THE SAME

(71) Applicant: ELITE ELECTRONIC MATERIAL (KUNSHAN) CO., LTD, Jiangsu Province (CN)

(72) Inventors: Rong-Tao Wang, Jiangsu Province (CN); Li-Chih Yu, Tao-Yuan Hsien (TW); Yu-Te Lin, Tao-Yuan Hsien (TW); Yi-Jen Chen, Taoyuan County (TW); Wenjun Tian, Jiangsu Province (CN); Ziqian Ma, Jiangsu Province (CN); Wenfeng Lu, Jiangsu Province (CN)

(73) Assignee: Elite Electronic Material (Kunshan) Co., Ltd (CN)

( * ) Notice: Subject to any disclaimer, the term of this patent is extended or adjusted under 35 U.S.C. 154(b) by 19 days.

(21) Appl. No.: 13/964,070

(22) Filed: Aug. 10, 2013

(65) Prior Publication Data

US 2014/0322541 A1   Oct. 30, 2014

(30) Foreign Application Priority Data

Apr. 24, 2013 (CN) .......................... 2013 1 0143919

(51) Int. Cl.
| | |
|---|---|
| *B32B 27/38* | (2006.01) |
| *C08L 63/04* | (2006.01) |
| *C08G 59/40* | (2006.01) |
| *C08G 59/62* | (2006.01) |
| *C08K 5/00* | (2006.01) |
| *H05K 1/03* | (2006.01) |
| *H05K 3/02* | (2006.01) |

(52) U.S. Cl.
CPC .......... *C08L 63/04* (2013.01); *C08G 59/4064* (2013.01); *C08G 59/621* (2013.01); *C08K 5/0066* (2013.01); *H05K 1/0373* (2013.01); *H05K 1/0366* (2013.01); *H05K 3/022* (2013.01); *H05K 2201/012* (2013.01); *H05K 2201/0209* (2013.01); *Y10T 428/31529* (2015.04)

(58) Field of Classification Search
None
See application file for complete search history.

(56) References Cited

U.S. PATENT DOCUMENTS

| | | | |
|---|---|---|---|
| 5,641,997 A * | 6/1997 | Ohta ....................... | C08L 63/00 257/788 |
| 7,255,925 B2 | 8/2007 | Chung et al. | |
| 2002/0068173 A1* | 6/2002 | Takano ................... | B32B 15/08 428/413 |
| 2009/0082494 A1* | 3/2009 | Kaprinidis .................... | 524/101 |
| 2009/0104429 A1* | 4/2009 | Goto ....................... | B32B 27/06 428/319.3 |
| 2011/0036625 A1* | 2/2011 | Narahashi et al. ........... | 174/261 |
| 2011/0303446 A1* | 12/2011 | Chen et al. ................... | 174/258 |
| 2013/0126218 A1* | 5/2013 | Gouzu ..................... | B32B 15/08 174/255 |
| 2013/0217283 A1* | 8/2013 | Arai ....................... | C08G 59/28 442/59 |
| 2014/0151094 A1* | 6/2014 | Takeuchi ................... | C08J 5/24 174/255 |

FOREIGN PATENT DOCUMENTS

| | | |
|---|---|---|
| TW | 200817469 | 4/2008 |
| TW | 201127899 | 8/2011 |
| WO | WO-2011152413 | * 12/2011 |
| WO | WO2012064662 | * 5/2012 |

OTHER PUBLICATIONS

English abstract of TW200817469.
English abstract of TW201127899.

* cited by examiner

*Primary Examiner* — Coris Fung
(74) *Attorney, Agent, or Firm* — St. Onge Steward Johnston & Reens, LLC

(57) ABSTRACT

A halogen-free resin composition, a copper clad laminate using the same, and a printed circuit board using the same are introduced. The halogen-free resin composition comprising (A) 100 parts by weight of epoxy resin; (B) 3 to 15 parts by weight of diaminodiphenyl sulfone (DDS); and (C) 5 to 70 parts by weight of phenolic co-hardener. The halogen-free resin composition features specific ingredients and proportion to thereby achieve satisfactory maximum preservation period of the prepreg manufactured from the halogen-free resin composition, control the related manufacturing process better, and attain satisfactory laminate properties, such as a high degree of water resistance, a high degree of heat resistance, and satisfactory dielectric properties, and thus is suitable for producing a prepreg or a resin film to thereby be applicable to copper clad laminates and printed circuit boards.

8 Claims, No Drawings

HALOGEN-FREE RESIN COMPOSITION, COPPER CLAD LAMINATE USING THE SAME, AND PRINTED CIRCUIT BOARD USING THE SAME

CROSS-REFERENCE TO RELATED APPLICATION

This non-provisional application claims priority under 35 U.S.C. §119(a) on Patent Application No(s). 201310143919.1 filed in China on Apr. 24, 2013, the entire contents of which are hereby incorporated by reference.

FIELD OF THE INVENTION

The present invention relates to halogen-free resin compositions, and more particularly, to a halogen-free resin composition for use with copper clad laminates and printed circuit boards.

BACKGROUND OF THE INVENTION

To get in line with the global trend of environmental protection and eco-friendly regulations, electronic product manufacturers nowadays are developing and manufacturing halogen-free electronic products. Advanced countries and electronic manufacturing giants set forth schedules of launching mass production of halogen-free electronic products. As a result of the promulgation of the Restriction of Hazardous Substances (RoHS) by the European Union, hazardous substances, such as lead, cadmium, mercury, hexavalent chromium, poly-brominated biphenyl (PBB), and poly-brominated diphenyl ether (PBDE), are strictly prohibited from being used in manufacturing electronic products or their parts and components. A printed circuit board (PCB) is an indispensable and fundamental basis of the semiconductor industry and electronic industry; hence, printed circuit boards bore the brunt of international halogen-free regulations when international organizations set forth strict requirements of the halogen content of printed circuit boards. For example, the International Electrotechnical Commission (IEC) 61249-2-21 requires that bromide content and chloride content shall be less than 900 ppm, and the total halogen content shall be less than 1500 ppm. The Japan Electronics Packaging and Circuits Association (JPCA) requires that both bromide content and chloride content shall be less than 900 ppm. To enforce its green policies, Greenpeace calls on manufacturers worldwide to get rid of polyvinyl chloride (PVC) and brominated flame retardants (BFRs) from their electronic products in order to conform with the lead-free and halogen-free requirements of green electronics. Hence, the industrial sector nowadays is interested in rendering related materials halogen-free and sees this technique as one of its key research topics.

Electronic products nowadays have the trend toward compactness and high-frequency transmission; hence, circuit boards nowadays typically feature a high-density layout and increasingly strict material requirements. To mount high-frequency electronic components on a circuit board, it is necessary that the substrate of the circuit board is made of a material of a low dielectric constant (Dk) and dielectric dissipation factor (Df) in order to maintain the transmission speed and the integrity of a signal transmitted. To allow the electronic components to function well at a high temperature and a high-humidity environment, it is necessary for the circuit board to be heat resistant, fire resistant, and of low hygroscopicity. A conventional circuit board manufacturing method, such as a conventional method of manufacturing a copper-clad substrate (also known as copper clad laminate, CCL), involves heating and combining a reinforcement material (such as a glass fiber fabric) and a thermosetting resin composition made of an epoxy resin and a curing agent to form a prepreg, and then laminating the prepreg and the upper and lower copper foils together at a high temperature and a high pressure. The prior art usually teaches using a thermosetting resin composed of an epoxy resin and a hydroxyl-containing phenol novolac resin curing agent. Due to the combination of the phenol novolac resin and the epoxy resin, epoxide ring-opening reactions end up with another hydroxyl which not only increases the dielectric constant (Dk) and the dielectric dissipation factor inherently, but also reacts with water readily and thereby renders the thermosetting resin more hygroscopic.

U.S. Pat. No. 7,255,925 discloses a thermosetting resin composition composed of cyanate ester resin, dicyclopentadiene (DCPD) epoxy resin, silica, and a thermoplastic resin. The thermosetting resin composition is characterized by a low dielectric constant (Dk) and a low dielectric dissipation factor. However, a method for manufacturing the thermosetting resin composition of U.S. Pat. No. 7,255,925 requires the use of a halogen-containing (such as bromine-containing) flame retardant, such as tetrabromocyclohexane, hexabromocyclodecane, or 2,4,6-tris(tribromophenoxy)-1,3,5-triazine. However, the bromine-containing flame retardant causes environmental pollution readily during the thermosetting resin composition manufacturing process, the using processing of thermosetting resin composition, and even after the thermosetting resin composition has been discarded or recycled. To ensure a low dielectric dissipation factor, low hygroscopicity, high cross-linking density, high glass transition temperature, high connectivity, appropriate thermal expansion, heat resistance, and fire resistance of copper clad laminates, an important factor lies in the selection of an epoxy resin, a curing agent, and a reinforcement material.

Taiwan published patent application 200817469 discloses a thermosetting resin composition which comprises an epoxy resin, a flame retardant, and a curing agent. The curing agent comprises dicyandiamide (DICY) and a low-temperature catalyst, wherein the curing agent contains an aromatic amine, such as diaminodiphenyl sulfone (DDS) as needed. However, the thermosetting resin composition uses both DICY and DDS as a curing agent, takes too much time to react with epoxy resin in order to cure, and results in high hygroscopy of a laminate subsequently formed.

Taiwan published patent application 201127899 discloses a resin composition which essentially comprises an epoxy resin, a curing accelerator, a cross-linking agent, and a phosphorus-containing resin. The phosphorus-containing resin is a DOPO-substituted or DOPO-derivative-substituted bisphenol novolac (BPN) resin or a phenol novolac (PN) resin. The cross-linking agent preferably comprises diaminodiphenyl sulfone (DDS). However, the resin composition uses phenol novolac resin and DDS as a curing agent, and cures too soon when it reacts with epoxy resin, thereby resulting in an overly short maximum preservation period of the prepreg manufactured from the resin composition, furthermore, the resin composition is accountable for unsatisfactory dielectric properties and overly high hygroscopicity of the laminate subsequently manufactured.

The major considerations given to electrical properties include the dielectric constant (Dk) and the dielectric dissipation factor. In general, the signal transmission speed of a laminate is inversely proportional to the square root of the dielectric constant (Dk) of the material from which the laminate is made, and thus the minimization of the dielectric constant (Dk) of the laminate material is usually advantageously important. The lower the dielectric dissipation factor is, the lesser the signal transmission attenuation is; hence, a material of a low dielectric dissipation factor provides satisfactory transmission quality.

Accordingly, it is important for printed circuit board material suppliers to develop materials which manifest a high degree of resistance to moisture and heat, satisfactory dielectric properties, and satisfactory curing duration, and apply the materials to high-frequency printed circuit board manufacturing.

SUMMARY OF THE INVENTION

In view of the aforesaid drawbacks of the prior art, the inventor of the present invention conceived room for improvement in the prior art and thus conducted extensive researches and experiments according to the inventor's years of experience in the related industry, and finally developed a halogen-free resin composition to thereby achieve satisfactory maximum preservation period of the prepreg manufactured from the resin composition, control the related manufacturing process better, and attain high water resistance, high heat resistance, and satisfactory dielectric properties expected of laminates.

The objective of the present invention is to provide a halogen-free resin composition which comprises specific ingredients and proportion to thereby achieve satisfactory maximum preservation period of the prepreg manufactured from the halogen-free resin composition, control the related manufacturing process better, and attain high water resistance, high heat resistance, and satisfactory dielectric properties expected of laminates, such that the halogen-free resin composition is fit for use in manufacturing a prepreg or a resin film to thereby enable the halogen-free resin composition to be applicable to copper clad laminates and printed circuit boards.

In order to achieve the above and other objectives, the present invention provides a halogen-free resin composition, comprising: (A) 100 parts by weight of epoxy resin; (B) 3 to 15 parts by weight of diaminodiphenyl sulfone (DDS) resin; and (C) 5 to 70 parts by weight of phenolic co-hardener.

The purpose of the aforesaid composition is to manufacture a prepreg, a resin film, a copper clad laminate, and a printed circuit board. Hence, the halogen-free resin composition of the present invention is characterized by specific ingredients and proportion required to achieve satisfactory maximum preservation period of the prepreg manufactured from the halogen-free resin composition, and attain high water resistance, high heat resistance, and satisfactory dielectric properties expected of laminates, such that the halogen-free resin composition is fit for use in manufacturing a prepreg or a resin film to thereby enable the halogen-free resin composition to be applicable to copper clad laminates and printed circuit boards.

As regards the halogen-free resin composition of the present invention, the ingredient (A) epoxy resin comprises one selected from the group consisting of bisphenol A epoxy resin, bisphenol F epoxy resin, bisphenol S epoxy resin, bisphenol AD epoxy resin, phenol novolac epoxy resin, bisphenol A novolac epoxy resin, bisphenol F novolac epoxy resin, o-cresol novolac epoxy resin, trifunctional epoxy resin, tetrafunctional epoxy resin, multifunctional epoxy resin, dicyclopentadiene (DCPD) epoxy resin, a phosphorus-containing epoxy resin, DOPO (9,10-dihydro-9-oxa-10-phosphaphenanthrene-10-oxide) epoxy resin, DOPO-HQ epoxy resin, p-xylene epoxy resin, naphthalene epoxy resin, benzopyran epoxy resin, biphenyl novolac epoxy resin, isocyanate modified epoxy resin, phenol benzaldehyde epoxy resin, and phenol aralkyl novolac epoxy resin, or comprises a combination thereof. The DOPO epoxy resin is DOPO-PN epoxy resin, DOPO-CNE epoxy resin, or DOPO-BPN epoxy resin. The DOPO-HQ epoxy resin is DOPO-HQ-PN epoxy resin, DOPO-HQ-CNE epoxy resin, or DOPO-HQ-BPN epoxy resin.

As regards the halogen-free resin composition of the present invention, given 100 parts by weight of epoxy resin, 3 to 15 parts by weight of the ingredient (B) diaminodiphenyl sulfone (DDS) is added thereto, wherein the content of DDS thus added enhances efficiently the cross-linking and curing effect of a reaction with epoxy resin and allows the halogen-free resin composition to achieve a high degree of heat resistance. If less than 3 parts by weight of DDS is added, the expected high degree of heat resistance cannot be achieved. If more than 15 parts by weight of DDS is added, the toughness of the halogen-free resin composition deteriorates.

As regards the halogen-free resin composition of the present invention, the ingredient (C) phenolic co-hardener comprises one of the following phenol novolac resins or a combination thereof: tetrafunctional phenolic resin, biphenyl-phenol novolac resin, xylok phenol novolac resin, DCPD-phenol resin, and naphthalene-containing phenol novolac resin. The tetrafunctional phenolic resin can be available with the brand name TPN resin which is manufactured by Nan Ya Plastics Corporation. The biphenyl-phenol novolac resin can be available with the brand name KPH-F4500 from Kolon. The xylok phenol novolac resin can be available with the brand name KPH-F3060 from Kolon. DCPD-phenol resin can be available with the brand name DPP-6095H from Kolon. The naphthalene-containing phenol novolac resin can be available with the brand name EXB-9500 from DIC. The specific structure of the phenol resin is illustrated as follows:

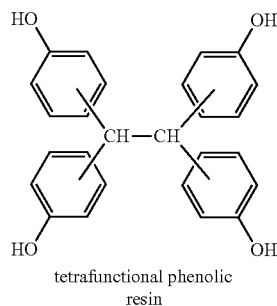
tetrafunctional phenolic resin

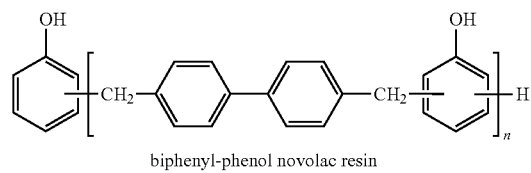
biphenyl-phenol novolac resin

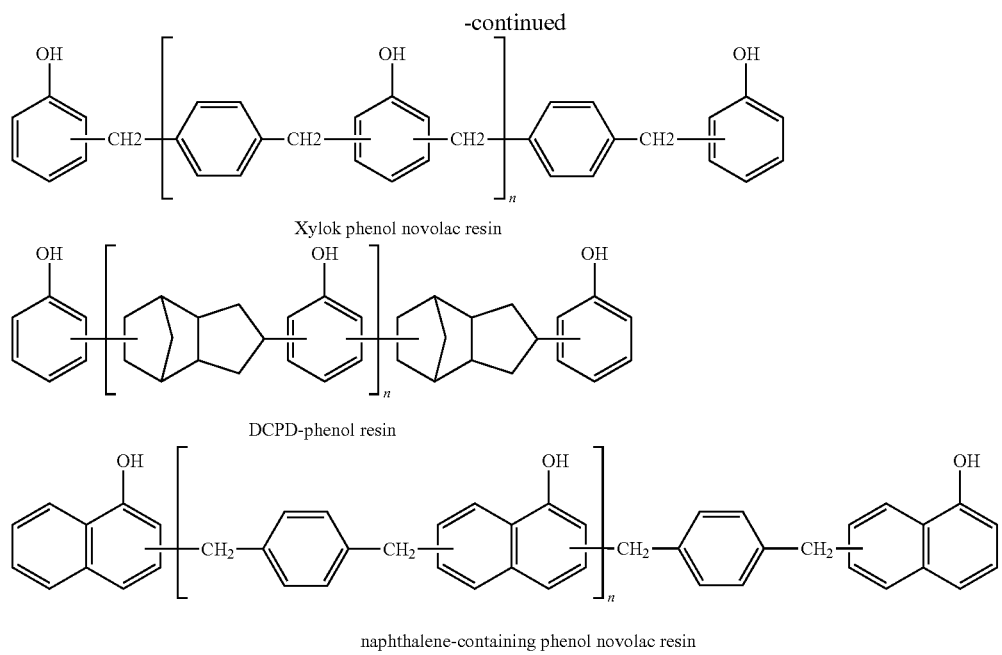

Xylok phenol novolac resin

DCPD-phenol resin naphthalene-containing phenol novolac resin where n denotes a natural number.

As regards the halogen-free resin composition of the present invention, given 100 parts by weight of epoxy resin, 5 to 70 parts by weight of phenolic co-hardener is added thereto, wherein the content of the phenolic co-hardener thus added allows the halogen-free resin composition to achieve the expected satisfactory dielectric properties, high degree of water resistance, and high degree of heat resistance. If less than 5 parts by weight of the phenolic co-hardener is added, the expected satisfactory dielectric properties, high degree of water resistance, and high degree of heat resistance will not be achieved. If more than 70 parts by weight of the phenolic co-hardener is added, the halogen-free resin composition will manifest deteriorated dielectric properties, increased brittleness, poor laminate malleability, and deteriorated chemical resistance, thereby reducing the conforming rate of the prepreg thus manufactured.

As regards the halogen-free resin composition of the present invention, if an epoxy resin undergoes a cross-linking reaction with diaminodiphenyl sulfone (DDS) and the phenolic co-hardener concurrently, the reactivity of the epoxy resin will decrease, and the maximum preservation period of a resultant varnish will be improved, so as to control gel-time better and achieve satisfactory dielectric properties, high degree of water resistance, and high degree of heat resistance of the halogen-free resin composition.

The halogen-free resin composition of the present invention further comprises (D) dicyandiamide (DICY) or a copolymer thereof, which has four reactive hydrogen atoms and one cyano group which take part in the curing reaction. For example, the DICY is one marketed by Kingyorker Enterprise Co., Ltd.

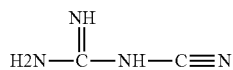

As regards the halogen-free resin composition of the present invention, given 100 parts by weight of epoxy resin, 0.1 to 10 parts by weight of dicyandiamide (DICY) is added thereto, wherein the content of the DICY thus added enables the halogen-free resin composition to achieve a satisfactory degree of toughness and laminate malleability. If less than 0.1 part by weight of DICY is added, the satisfactory degree of toughness and laminate malleability expected of the halogen-free resin composition will not be achieved. If more than 10 parts by weight of DICY is added, the laminate made of the halogen-free resin composition will be flawed with overly low heat resistance, overly high hygroscopicity, and thus cause unsatisfactory physical properties of the laminate.

The halogen-free resin composition of the present invention further comprises a halogen-free flame retardant. The halogen-free flame retardant is a nitrogen-containing flame retardant or a phosphorus-containing flame retardant. The halogen-free flame retardant includes, but is not limited to, at least one of bisphenol diphenyl phosphate, ammonium polyphosphate, hydroquinone bis-(diphenyl phosphate), bis-phenol A bis-(diphenylphosphate), tri(2-carboxyethyl)phosphine (TCEP), tris(chloroisopropyl)phosphate (TCPP), trimethyl phosphate (TMP), dimethyl methyl phosphonate (DMMP), resorcinol dixylenylphosphate (RDXP, such as PX-200), phosphazene (such as SPB-100), m-phenylene methylphosphonate (PMP), melamine polyphosphate, melamine cyanurate, and tri-hydroxy ethyl isocyanurate. Furthermore, examples of the halogen-free flame retardant include 9,10-dihydro-9-oxa-10-phosphaphenanthrene-10-oxide (DOPO), DOPO phenolic resin (such as DOPO-HQ, DOPO-PN, DOPO-BPN), DOPO epoxy resin, and DOPO-HQ epoxy resin, wherein DOPO-BPN is a bisphenol A novolac resin, such as DOPO-BPAN, DOPO-BPFN, or DOPO-BPSN.

As regards the halogen-free resin composition of the present invention, given 100 parts by weight of epoxy resin, 10 to 100 parts by weight of the halogen-free flame retardant is added thereto, wherein the content of the halogen-free flame retardant thus added enables the halogen-free resin composition to effectuate flame retardation. If less than 10 parts by weight of the halogen-free flame retardant is added, the expected flame retardation will not be achieved. If more than 100 parts by weight of the halogen-free flame retardant is added, the resultant halogen-free resin composition will feature increased hygroscopicity and deteriorated laminate heat resistance.

The halogen-free resin composition of the present invention further comprises one of an inorganic filler, a curing accelerator, a silane coupling agent, a toughening agent, and a solvent, or a combination thereof.

The purpose of adding an inorganic filler to the halogen-free resin composition of the present invention is to not only enable the resin composition to manifest enhanced the thermal conductivity, improved thermal expansion properties, and enhanced mechanical strength, but also enable the inorganic filler to be uniformly distributed in the halogen-free resin composition. The inorganic filler comprises silicon dioxide (fused, non-fused, porous, or hollow), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, quartz, boehmite (AlOOH), calcinated talc, talc, silicon nitride, or calcinated kaolinite. The inorganic filler is spherical, fiber-like, plate-like, particle-like, sheet-like, or needle-shaped, and can be selectively pretreated with a silane coupling agent.

The inorganic filler comprises particulate powder with a particle diameter of less than 100 nm, preferably particulate powder with a particle diameter of 1 nm to 20 nm, and most preferably nanoscale particulate powder with a particle diameter of less than 1 nm.

As regards the halogen-free resin composition of the present invention, given 100 parts by weight of epoxy resin, 10 to 1000 parts by weight of the inorganic filler is added thereto. If less than 10 parts by weight of the inorganic filler is added, the halogen-free resin composition will not manifest increased thermal conductivity, improved thermal expansion, or enhanced mechanical strength. If more than 1000 parts by weight of the inorganic filler is added, the halogen-free resin composition will manifest deteriorated hole-filling fluidity and deteriorated attachment to the copper foils.

The curing accelerator of the present invention comprises a catalysts, such as a Lewis base or a Lewis acid. The Lewis base includes at least one of imidazole, boron trifluoride amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP), and 4-dimethylaminopyridine (DMAP). The Lewis acid comprises a metal salt compound, such as a manganese, iron, cobalt, nickel, copper, or zinc metal salt compound, for example, a metal catalyst, such as zinc caprylate, or cobalt caprylate.

The silane coupling agent of the present invention comprises silanes and siloxanes which are of the following types, namely amino silane, amino siloxane, epoxy silane, and epoxy siloxane, according to functional group.

The toughening agent of the present invention comprises rubber resin, carboxyl-terminated butadiene acrylonitrile (CTBN) rubber, and/or core-shell rubber.

The solvent of the present invention comprises methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethyl formamide, propylene glycol methyl ether, or a mixture thereof.

The halogen-free resin composition of the present invention further comprises one of polyphenylene ether resin, cyanate ester resin, isocyanate ester resin, maleimide resin, polyester resin, styrene resin, butadiene resin, phenoxy resin, polyamide resin, and polyimide resin, or a combination thereof.

Another objective of the present invention is to provide a prepreg which features a satisfactory preservation period, a high degree of water resistance, a high degree of heat resistance, and satisfactory dielectric properties. To this end, the present invention provides a prepreg comprising a reinforcing material and the aforesaid halogen-free resin composition, wherein the resin composition is attached to the reinforcing material and heated up at a high temperature to become semi-cured. The reinforcing material, which is a fibrous material, a woven fabric, or a non-woven fabric, such as a glass fiber fabric, is intended to increase the mechanical strength of the prepreg. Also, the reinforcing material can be selectively pretreated with a silane coupling agent or a siloxane coupling agent. For example, the glass fiber fabric is pretreated with the silane coupling agent.

When heated up at a high temperature or heated up at a high temperature and a high pressure, the prepreg can be cured to form a cured prepreg or a solid-state insulating layer, wherein, if the halogen-free resin composition contains a solvent, the solvent will evaporate and escape during a high-temperature heating process.

Yet another objective of the present invention is to provide a copper clad laminate which has satisfactory dielectric properties, a high degree of water resistance, and a high degree of heat resistance. To this end, the present invention provides a copper clad laminate comprising at least two copper foils and at least one insulating layer. The copper foil can further comprise an alloy of copper, aluminum, nickel, platinum, silver, and/or gold. The insulating layer is formed by curing the aforesaid prepreg at a high temperature and a high pressure, for example, by compressing the aforesaid prepreg sandwiched between two pieces of copper foil at a high temperature and a high pressure.

Advantages of the copper-clad laminate of the present invention include, but are not limited to, the following: satisfactory dielectric properties, a high degree of water resistance, a high degree of heat resistance, and being halogen-free. The copper-clad laminate undergoes a wiring fabrication process to form a circuit board, wherein, after electronic components have been mounted on and electrically connected to the circuit board, the circuit board operates well even at adverse environments, such as high temperature and high humidity.

A further objective of the present invention is to provide a printed circuit board which has satisfactory dielectric properties, a high degree of water resistance, a high degree of heat resistance, and being halogen-free. The circuit board comprises at least one aforesaid copper clad laminate, and the circuit board can be manufactured by a conventional manufacturing process.

To further disclose the present invention and enable persons skilled in the art to implement the present invention accordingly, the present invention is further illustrated with several embodiments hereunder. The embodiments below are illustrative of the present invention only, but should not be interpreted as restrictive of the scope of the present invention. Hence, all equivalent modifications and variations made to the aforesaid embodiments should fall within the scope of the present invention.

DETAILED DESCRIPTION OF THE PREFERRED EMBODIMENTS

Objectives, features, and advantages of the present invention are hereunder illustrated with specific embodiments:

Embodiment 1 (E1)

A resin composition, comprising ingredients as follows:
(A) 70 parts by weight of phenol novolac epoxy resin (N-770, purchased from Dainippon Ink and Chemicals Incorporated (D. I. C.));
(B) 30 parts by weight of bisphenol A novolac epoxy resin (N-865, purchased from D. I. C.);
(C) 7 parts by weight of diaminodiphenyl sulfone (DDS, purchased from Atul LTD);
(D) 54 parts by weight of DCPD-phenol resin (DPP-6095H, purchased from Kolon);
(E) 45 parts by weight of flame retardant (XZ92741, purchased from The Dow Chemical Company);
(F) 50 parts by weight of inorganic filler (fused silica, purchased from Sibelco);
(G) 0.2 parts by weight of catalyst (2E4MI, purchased from Shikoku Chemicals Corporation); and
(H) 30 parts by weight of propylene glycol methyl ether (PM).

Embodiment 2 (E2)

A resin composition, comprising ingredients as follows:
(A) 70 parts by weight of phenol novolac epoxy resin (N-770, purchased from D. I. C.);
(B) 30 parts by weight of bisphenol A novolac epoxy resin (N-865, purchased from D. I. C.);
(C) 7 parts by weight of diaminodiphenyl sulfone (DDS, purchased from Atul LTD);
(D) 30 parts by weight of tetrafunctional phenolic resin (KPE-F3110, purchased from Kolon);
(E) 45 parts by weight of flame retardant (XZ92741, purchased from The Dow Chemical Company);
(F) 50 parts by weight of inorganic filler (fused silica, purchased from Sibelco);
(G) 0.2 parts by weight of catalyst (2E4MI, purchased from Shikoku Chemicals Corporation); and
(H) 30 parts by weight of propylene glycol methyl ether (PM).

Embodiment 3 (E3)

A resin composition, comprising ingredients as follows:
(A) 70 parts by weight of phenol novolac epoxy resin (N-770, purchased from D. I. C.);
(B) 30 parts by weight of bisphenol A novolac epoxy resin (N-865, purchased from D. I. C.);
(C) 7 parts by weight of diaminodiphenyl sulfone (DDS, purchased from Atul LTD);
(D) 55 parts by weight of biphenyl-phenol novolac resin (KPH-F4500, purchased from Kolon);
(E) 45 parts by weight of flame retardant (XZ92741, purchased from The Dow Chemical Company);
(F) 50 parts by weight of inorganic filler (fused silica, purchased from Sibelco);
(G) 0.2 parts by weight of catalyst (2E4MI, purchased from Shikoku Chemicals Corporation); and
(H) 30 parts by weight of propylene glycol methyl ether (PM).

Embodiment 4 (E4)

A resin composition, comprising ingredients as follows:
(A) 70 parts by weight of phenol novolac epoxy resin (N-770, purchased from D. I. C.);
(B) 30 parts by weight of bisphenol A novolac epoxy resin (N-865, purchased from D. I. C.);
(C) 7 parts by weight of diaminodiphenyl sulfone (DDS, purchased from Atul LTD);
(D) 55 parts by weight of xylok phenol novolac resin (KPH-F3060, purchased from Kolon);
(E) 45 parts by weight of flame retardant (XZ92741, purchased from The Dow Chemical Company);
(F) 50 parts by weight of inorganic filler (fused silica, purchased from Sibelco);
(G) 0.2 parts by weight of catalyst (2E4MI, purchased from Shikoku Chemicals Corporation); and
(H) 30 parts by weight of propylene glycol methyl ether (PM).

Embodiment 5 (E5)

A resin composition, comprising ingredients as follows:
(A) 70 parts by weight of phenol novolac epoxy resin (N-770, purchased from D. I. C.);
(B) 30 parts by weight of bisphenol A novolac epoxy resin (N-865, purchased from D. I. C.);
(C) 15 parts by weight of diaminodiphenyl sulfone (DDS, purchased from Atul LTD);
(D) 7 parts by weight of naphthalene-containing phenol novolac resin (EXB-9500, purchased from D. I. C.);
(E) 45 parts by weight of flame retardant (XZ92741, purchased from The Dow Chemical Company);
(F) 50 parts by weight of inorganic filler (fused silica, purchased from Sibelco);
(G) 0.2 parts by weight of catalyst (2E4MI, purchased from Shikoku Chemicals Corporation); and
(H) 30 parts by weight of propylene glycol methyl ether (PM).

Embodiment 6 (E6)

A resin composition, comprising ingredients as follows:
(A) 70 parts by weight of phenol novolac epoxy resin (N-770, purchased from D. I. C.);
(B) 30 parts by weight of bisphenol A novolac epoxy resin (N-865, purchased from D. I. C.);
(C) 3 parts by weight of diaminodiphenyl sulfone (DDS, purchased from Atul LTD);
(D) 35 parts by weight of biphenyl-phenol novolac resin (KPH-F4500, purchased from Kolon)
(E) 35 parts by weight of naphthalene-containing phenol novolac resin (EXB-9500, purchased from D. I. C.);
(F) 45 parts by weight of flame retardant (XZ92741, purchased from The Dow Chemical Company);
(G) 50 parts by weight of inorganic filler (fused silica, purchased from Sibelco);
(H) 0.2 parts by weight of catalyst (2E4MI, purchased from Shikoku Chemicals Corporation); and
(I) 30 parts by weight of propylene glycol methyl ether (PM).

Embodiment 7 (E7)

A resin composition, comprising ingredients as follows:
(A) 70 parts by weight of phenol novolac epoxy resin (N-770, purchased from D. I. C.);
(B) 30 parts by weight of bisphenol A novolac epoxy resin (N-865, purchased from D. I. C.);
(C) 3 parts by weight of diaminodiphenyl sulfone (DDS, purchased from Atul LTD);
(D) 25 parts by weight of biphenyl-phenol novolac resin (KPH-F4500, purchased from Kolon)

(E) 25 parts by weight of naphthalene-containing phenol novolac resin (EXB-9500, purchased from D. I. C.);
(F) 1.3 parts by weight of dicyandiamide (DICY, purchased from Kingyorker Enterprise Co. Ltd.);
(G) 45 parts by weight of flame retardant (XZ92741, purchased from The Dow Chemical Ccompany);
(H) 50 parts by weight of inorganic filler (fused silica, purchased from Sibelco);
(I) 0.2 parts by weight of catalyst (2E4MI, purchased from Shikoku Chemicals Corporation); and
(J) 30 parts by weight of propylene glycol methyl ether (PM).

Embodiment 8 (E8)

A resin composition, comprising ingredients as follows:
(A) 30 parts by weight of phenol novolac epoxy resin (N-770, purchased from D. I. C.);
(B) 70 parts by weight of bisphenol A novolac epoxy resin (N-865, purchased from D. I. C.);
(C) 5 parts by weight of diaminodiphenyl sulfone (DDS, purchased from Atul LTD);
(D) 20 parts by weight of xylok phenol novolac resin (KPH-F3060, purchased from Kolon);
(E) 15 parts by weight of DCPD-phenol resin (DPP-6095H, purchased from Kolon);
(F) 2 parts by weight of dicyandiamide (DICY, purchased from Kingyorker Enterprise Co. Ltd.);
(G) 45 parts by weight of flame retardant (XZ92741, purchased from The Dow Chemical Company);
(H) 50 parts by weight of inorganic filler (fused silica, purchased from Sibelco);
(I) 0.2 parts by weight of catalyst (2E4MI, purchased from Shikoku Chemicals Corporation); and
(J) 30 parts by weight of propylene glycol methyl ether (PM).

Comparison 1 (C1)

A resin composition, comprising ingredients as follows:
(A) 70 parts by weight of phenol novolac epoxy resin (N-770, purchased from D. I. C.);
(B) 30 parts by weight of bisphenol A novolac epoxy resin (N-865, purchased from D. I. C.);
(C) 18 parts by weight of diaminodiphenyl sulfone (DDS, purchased from Atul LTD);
(D) 45 parts by weight of flame retardant (XZ92741, purchased from The Dow Chemical Company);
(E) 50 parts by weight of inorganic filler (fused silica, purchased from Sibelco);
(F) 0.4 parts by weight of catalyst (2E4MI, purchased from Shikoku Chemicals Corporation); and
(G) 30 parts by weight of methyl ethyl ketone (MEK).

Comparison 2 (C2)

A resin composition, comprising ingredients as follows:
(A) 70 parts by weight of phenol novolac epoxy resin (N-770, purchased from D. I. C.);
(B) 30 parts by weight of bisphenol A novolac epoxy resin (N-865, purchased from D. I. C.);
(C) 9 parts by weight of diaminodiphenyl sulfone (DDS, purchased from Atul LTD);
(D) 31 parts by weight of phenol novolac resin (TD-2090, purchased from Kolon);
(E) 45 parts by weight of flame retardant (XZ92741, purchased from The Dow Chemical Company);
(F) 50 parts by weight of inorganic filler (fused silica, purchased from Sibelco);
(G) 0.2 parts by weight of catalyst (2E4MI, purchased from Shikoku Chemicals Corporation); and
(H) 30 parts by weight of methyl ethyl ketone (MEK).

Comparison 3 (C3)

A resin composition, comprising ingredients as follows:
(A) 70 parts by weight of phenol novolac epoxy resin (N-770, purchased from D. I. C.);
(B) 30 parts by weight of bisphenol A novolac epoxy resin (N-865, purchased from D. I. C.);
(C) 51 parts by weight of phenol novolac resin (TD-2090, purchased from Kolon);
(D) 1 part by weight of dicyandiamide (DICY, purchased from Kingyorker Enterprise Co. Ltd.);
(E) 45 parts by weight of flame retardant (XZ92741, purchased from The Dow Chemical Company);
(F) 50 parts by weight of inorganic filler (fused silica, purchased from Sibelco);
(G) 0.1 part by weight of catalyst (2E4MI, purchased from Shikoku Chemicals Corporation); and
(H) 30 parts by weight of methyl ethyl ketone (MEK).

Comparison 4 (C4)

A resin composition, comprising ingredients as follows:
(A) 70 parts by weight of phenol novolac epoxy resin (N-770, purchased from D. I. C.);
(B) 30 parts by weight of bisphenol A novolac epoxy resin (N-865, purchased from D. I. C.);
(C) 9 parts by weight of diaminodiphenyl sulfone (DDS, purchased from Atul LTD);
(D) 14 parts by weight of phenol novolac resin (TD-2090, purchased from Kolon);
(E) 2 parts by weight of dicyandiamide (DICY, purchased from Kingyorker Enterprise Co. Ltd.);
(F) 45 parts by weight of flame retardant (XZ92741, purchased from The Dow Chemical Company);
(G) 50 parts by weight of inorganic filler (fused silica, purchased from Sibelco);
(H) 0.1 part by weight of catalyst (2E4MI, purchased from Shikoku Chemicals Corporation); and
(I) 30 parts by weight of propylene glycol methyl ether (PM).

Comparison 5 (C5)

A resin composition, comprising ingredients as follows:
(A) 30 parts by weight of phenol novolac epoxy resin (N-770, purchased from D. I. C.);
(B) 70 parts by weight of bisphenol A novolac epoxy resin (N-865, purchased from D. I. C.);
(C) 9 parts by weight of diaminodiphenyl sulfone (DDS, purchased from Atul LTD);
(D) 25 parts by weight of amino triazine novolac resin (ATN, purchased from D. I. C.);
(E) 45 parts by weight of flame retardant (XZ92741, purchased from The Dow Chemical Company);
(F) 50 parts by weight of inorganic filler (Fused silica, purchased from Sibelco);
(G) 0.2 parts by weight of catalyst (2E4MI, purchased from Shikoku Chemicals Corporation); and
(H) 30 parts by weight of propylene glycol methyl ether (PM).

Comparison 6 (C6)

A resin composition, comprising ingredients as follows:
(A) 30 parts by weight of phenol novolac epoxy resin (N-770, purchased from D. I. C.);
(B) 70 parts by weight of bisphenol A novolac epoxy resin (N-865, purchased from D. I. C.);
(C) 9 parts by weight of diaminodiphenyl sulfone (DDS, purchased from Atul LTD);
(D) 3 parts by weight of dicyandiamide (DICY, purchased from Kingyorker Enterprise Co. Ltd.);

(E) 45 parts by weight of flame retardant (XZ92741, purchased from The Dow Chemical Company);

(F) 50 parts by weight of inorganic filler (fused silica, purchased from Sibelco);

(G) 0.2 parts by weight of catalyst (2E4MI, purchased from Shikoku Chemicals Corporation); and (H) 30 parts by weight of propylene glycol methyl ether (PM).

Ingredients of the resin composition in embodiments 1-8 are enumerated in Table 1. Ingredients of the resin composition in comparisons 1-6 are enumerated in Table 3.

The ingredients of the resin composition in embodiments 1 through 8 and comparisons 1 through 6 are evenly mixed in a blender by batch before being put into an impregnation tank. Then, a glass fiber fabric is passed through the impregnation tank to allow the resin composition to adhere to the glass fiber fabric before undergoing a heating and baking process to become semi-cured, thereby forming a prepreg.

A piece of 18-μm copper foil, four pieces of the prepreg prepared by the same batch, and another piece of 18-μm copper foil are stacked in sequence before being laminated against each other in vacuum at 200° C. for two hours to form a copper-clad laminate (CCL), wherein, the four pieces of prepreg are cured to form an insulating layer between the two copper foils.

A physical properties measurement process is performed on the copper-clad laminates and the copper-free laminates of the etched copper foils. The physical properties measurement process entails: heat resistance (T288) of the copper-clad laminates, solder dip test of copper-clad laminate (perform solder dip at 288° C. for 10 seconds, to measure heat resistance cycle, S/D), solder dip test of copper-free laminate after undergoing pressure cooker test to absorb moisture (undergo pressure cooking at 121° C. for one hour and three hours, then solder dip at 288° C. for 20 seconds to observe the presence of delamination), dielectric constant (Dk, wherein low Dk is desirable), dielectric dissipation factor (Df, wherein low Df is desirable), and the storage period (i.e., the number of days between the prepreg manufacturing date and the lamination date, wherein the lamination date will be regarded as valid, provided that, upon the lamination of prepreg, the physical properties of the laminate still meet the physical properties specifications.)

The results of measurement of the resin composition in embodiments 1-8 are enumerated in Table 2. The results of measurement of the resin composition in comparisons 1-6 are enumerated in Table 4.

TABLE 1 ingredients of the resin composition in embodiments 1-8

| ingredient | | E1 | E2 | E3 | E4 | E5 | E6 | E7 | E8 |
|---|---|---|---|---|---|---|---|---|---|
| epoxy resin | N-770 | 70 | 70 | 70 | 70 | 70 | 70 | 70 | 30 |
| | N-865 | 30 | 30 | 30 | 30 | 30 | 30 | 30 | 70 |
| diaminodiphenyl sulfone | DDS | 7 | 7 | 7 | 7 | 15 | 3 | 3 | 5 |
| tetrafunctional phenolic resin | KPE-F3110 | — | 30 | — | — | — | — | — | — |
| biphenyl-phenol novolac resin | KPH-F4500 | — | — | 55 | — | — | 35 | 25 | — |
| xylok phenol novolac resin | KPH-F3060 | — | — | — | 55 | — | — | — | 20 |
| DCPD-phenol resin | DPP-6095H | 54 | — | — | — | — | — | — | 15 |
| naphthalene-containing phenol novolac resin | EXB-9500 | — | — | — | — | 7 | 35 | 25 | — |
| dicyandiamide | DICY | — | — | — | — | — | — | 1.3 | 2 |
| flame retardant | XZ92741 | 45 | 45 | 45 | 45 | 45 | 45 | 45 | 45 |
| inorganic filler | fused silica | 50 | 50 | 50 | 50 | 50 | 50 | 50 | 50 |
| catalyst | 2E4MI | 0.2 | 0.2 | 0.2 | 0.2 | 0.2 | 0.2 | 0.2 | 0.2 |
| solvent | PM | 30 | 30 | 30 | 30 | 30 | 30 | 30 | 30 |

TABLE 2 results of measurement of the resin composition in embodiments 1-8

| property | method | E1 | E2 | E3 | E4 | E5 | E6 | E7 | E8 |
|---|---|---|---|---|---|---|---|---|---|
| T288 (clad) | TMA (min) | 40 | 43 | 45 | 41 | 50 | 54 | 53 | 48 |
| S/D | dip cycles | >20 | >20 | >20 | >20 | >20 | >20 | >20 | >20 |
| PCT (1 hr) | dip 288☐, 20 s | Pass | Pass | Pass | Pass | Pass | Pass | Pass | Pass |
| PCT (3 hr) | dip 288☐, 20 s | Pass | Pass | Pass | Pass | Pass | Pass | Pass | Pass |
| Dk | 1 GHz | 4.25 | 4.40 | 4.31 | 4.29 | 4.45 | 4.23 | 4.21 | 4.18 |
| Df | 1 GHz | 0.011 | 0.012 | 0.009 | 0.010 | 0.013 | 0.009 | 0.009 | 0.011 |
| preservation period | number of days | >105 | 105 | >105 | >105 | >105 | >105 | >105 | 90 |

TABLE 3 ingredients of the resin composition in comparisons 1-6

| ingredient | | C1 | C2 | C3 | C4 | C5 | C6 |
|---|---|---|---|---|---|---|---|
| epoxy resin | N-770 | 70 | 70 | 70 | 70 | 30 | 30 |
| | N-865 | 30 | 30 | 30 | 30 | 70 | 70 |
| diaminodiphenyl sulfone | DDS | 18 | 9 | — | 9 | 9 | 9 |
| phenol novolac resin | TD-2090 | — | 31 | 51 | 14 | — | — |
| dicyandiamide | DICY | — | — | 1 | 2 | — | 3 |
| amino triazine novolac resin | ATN | — | — | — | — | 25 | — |
| flame retardant | XZ92741 | 45 | 45 | 45 | 45 | 45 | 45 |
| inorganic filler | fused silica | 50 | 50 | 50 | 50 | 50 | 50 |
| catalyst | 2E4MI | 0.4 | 0.2 | 0.1 | 0.1 | 0.2 | 0.2 |
| solvent | MEK | 30 | 30 | 30 | — | — | — |
| solvent | PM | — | — | — | 30 | 30 | 30 |

TABLE 4 results of measurement of the resin composition in comparisons 1-6

| property | method | C1 | C2 | C3 | C4 | C5 | C6 |
|---|---|---|---|---|---|---|---|
| T288 (clad) | TMA (min) | 40 | 25 | 20 | 15 | 10 | 38 |
| S/D | dip cycles | >20 | 15 | 13 | 12 | 10 | 16 |
| PCT(1 hr) | dip 288□, 20 s | delam | pass | pass | pass | pass | delam |
| PCT(3 hr) | dip 288□, 20 s | delam | delam | delam | delam | delam | delam |
| Dk | 1 GHz | 4.55 | 4.50 | 4.45 | 4.45 | 4.65 | 4.36 |
| Df | 1 GHz | 0.016 | 0.016 | 0.015 | 0.015 | 0.018 | 0.017 |
| preservation period | number of days | >105 | 55 | 45 | 35 | 60 | 90 |

A comparison of embodiments 1-8 and comparisons 1-6 reveals the following. The prepreg preservation period of embodiments 1-8 exceeds 90 days, whereas the preservation period of comparisons 2-5 is shorter than 60 days. In embodiments 1-8, laminate heat resistance meet requirements, wherein T288 exceeds 40 minutes without delamination, S/D test can be performed for more than 20 rounds without delamination, and PCT test is performed without delamination after the copper-free laminate undergoing pressure cooker test to absorb moisture for 3 hours. Embodiment 6 and embodiment 7 manifest preferable laminate properties. In comparison 1 and comparison 6, although the prepreg preservation period exceeds 90 days, laminate heat resistance (T288, S/D, PCT) is unsatisfactory. In comparison 2, where both DDS and phenol novolac resin are used, although the copper-free laminate don't delaminate after undergoing PCT (1 hr) test, the laminate manifests significantly unsatisfactory heat resistance properties and deteriorated dielectric properties. In comparison 3, where both dicyandiamide (DICY) and phenol novolac resin are used, although the copper-free laminate don't delaminate after undergoing PCT (1 hr) test, the laminate manifests significantly unsatisfactory heat resistance properties and deteriorated dielectric properties. In comparison 4, where DDS, DICY and phenol novolac resin are used, although the copper-free laminate don't delaminate after undergoing PCT (1 hr) test, the laminate manifests significantly unsatisfactory heat resistance properties and deteriorated dielectric properties. In comparison 5, where both DDS and amino triazine novolac resin are used, although the copper-free laminate don't delaminate after undergoing PCT (1 hr) test, the laminate manifests significantly unsatisfactory heat resistance properties and deteriorated dielectric properties. Hence, the halogen-free resin composition of the present invention not only improves the prepreg preservation period, but also significantly enhances laminate heat resistance and achieves preferable dielectric properties.

Hence, the present invention meets the three requirements of patentability, namely novelty, non-obviousness, and industrial applicability. Regarding novelty and non-obviousness, the present invention discloses a halogen-free resin composition characterized by specific ingredients and proportion required to achieve satisfactory maximum preservation period of the prepreg manufactured from the halogen-free resin composition, and attain high water resistance, high heat resistance, and satisfactory dielectric properties expected of laminates, such that the halogen-free resin composition is fit for use in manufacturing a prepreg or a resin film to thereby enable the halogen-free resin composition to be applicable to copper clad laminates and printed circuit boards. Regarding industrial applicability, products derived from the present invention meet market demands fully.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:

1. A halogen-free resin composition, comprising:
  (A) 100 parts by weight of epoxy resin;
  (B) 3 to 15 parts by weight of diaminodiphenyl sulfone (DDS); and
  (C) 7 to 55 parts by weight of phenolic co-hardener, wherein the phenolic co-hardener comprises at least one of tetrafunctional phenolic resin, biphenyl-phenol novolac resin, xylok phenol novolac resin, dicyclopentadiene-phenol resin (DCPD-phenol resin), and naphthalene-containing phenol novolac resin, or a combination thereof;

wherein the epoxy resin is a combination of phenol novolac epoxy resin and bisphenol A novolac epoxy resin.

2. The halogen-free resin composition of claim 1, further comprising 0.1 to 10 parts by weight of dicyandiamide (DICY).

3. The halogen-free resin composition of claim 1, further comprising a halogen-free flame retardant being at least one of bisphenol diphenyl phosphate, ammonium polyphosphate, hydroquinone bis-(diphenyl phosphate), bisphenol A bis-(diphenylphosphate), tri(2-carboxyethyl)phosphine (TCEP), tris(chloroisopropyl) phosphate (TCPP), trimethyl phosphate (TMP), dimethyl methyl phosphonate (DMMP), resorcinol dixylenylphosphate (RDXP), phosphazene, m-phenylene methylphosphonate (PMP), melamine polyphosphate, melamine cyanurate, tri-hydroxy ethyl isocyanurate, 9,10-dihydro-9-oxa-10-phosphaphenanthrene-10-oxide (DOPO), 9,10-dihydro-9-oxa-10-phosphaphenanthrene-10-oxide phenolic resin (DOPO phenolic resin), 9,10-dihydro-9-oxa-10-phosphaphenanthrene-10-oxide-containing epoxy resin (DOPO-containing epoxy resin), and 2-(10H-9-Oxa-10-phospha-1-phenanthryl) hydroquinone phosphorus oxide-containing epoxy resin (DOPO-HQ-containing epoxy resin).

4. The halogen-free resin composition of claim 1, further comprising at least one of an inorganic filler, a curing accelerator, a silane coupling agent, a toughening agent, and a solvent.

5. The halogen-free resin composition of claim 4, further comprising at least one of polyphenylene ether resin, cyanate ester resin, isocyanate ester resin, maleimide, polyester resin, styrene resin, butadiene resin, phenoxy resin, polyamide resin, and polyimide resin, or a modified derivative thereof.

6. A prepreg, comprising the halogen-free resin composition of claim 1.

7. A copper clad laminate, comprising the prepreg of claim 6.

8. A printed circuit board, comprising the copper clad laminate of claim 7.

* * * * *